(12) United States Patent
Lin et al.

(10) Patent No.: US 7,234,230 B1
(45) Date of Patent: Jun. 26, 2007

(54) COMPOSITE CIRCUIT BOARD AND METHOD FOR MANUFACTURING THE SAME

(75) Inventors: Ting-Hao Lin, Taoyuan (TW); Chung-Yuan Chen, Taoyuan (TW)

(73) Assignee: Gold Circuit Electronics Ltd., Taoyuan (TW)

( * ) Notice: Subject to any disclaimer, the term of this patent is extended or adjusted under 35 U.S.C. 154(b) by 0 days.

(21) Appl. No.: 11/319,998

(22) Filed: Dec. 27, 2005

(51) Int. Cl.
*H01R 43/00* (2006.01)
(52) U.S. Cl. .................... 29/825; 29/840; 29/832; 29/846
(58) Field of Classification Search .......... 29/825, 29/830, 846, 832, 840
See application file for complete search history.

(56) References Cited

U.S. PATENT DOCUMENTS

| 5,761,795 | A | * | 6/1998 | Ohta .......................... 29/739 |
| 5,899,757 | A | * | 5/1999 | Neidich et al. .............. 439/67 |
| 6,036,502 | A | * | 3/2000 | Neidich et al. .............. 439/67 |
| 6,258,627 | B1 | * | 7/2001 | Benenati et al. ............ 438/108 |
| 2002/0129894 | A1 | * | 9/2002 | Liu et al. .................... 156/291 |

* cited by examiner

*Primary Examiner*—Carl J. Arbes
(74) *Attorney, Agent, or Firm*—James H. Walters

(57) ABSTRACT

A composite circuit board comprises multiple soft panels evenly mounted on a rigid panel. The soft panels are positioned on the rigid panel in proper alignment via locating pins on the rigid panel and corresponding holes in the soft panels. The soft panels are securely bonded to the rigid panel to form the composite circuit boards. The smaller size of the soft panels minimizes the alignment problems caused by the different heat expansion rates of the soft panel and the rigid panel.

5 Claims, 3 Drawing Sheets

COMPOSITE CIRCUIT BOARD AND METHOD FOR MANUFACTURING THE SAME

BACKGROUND OF THE INVENTION

1. Field of the Invention

The present invention relates to a composite circuit board and a method, and more particularly to a composite circuit board that comprises multiple soft panels on a single rigid panel and a method for manufacturing the same.

2. Description of the Related Art

A conventional composite circuit board comprises a soft panel with circuitry and a rigid panel on which the soft panel is mounted. The advantage of the composite circuit board over a conventional printed circuit board is superior thinness and lightness. The composite circuit board is widely used in electronic products and in military applications.

With reference to FIG. 4, a conventional composite circuit board has a soft panel (30) and a rigid panel (40), on which the soft panel (30) is mounted. The soft panel (30) is the same size as that of the rigid panel (40). Electronic circuitry is provided on the soft panel (30) and multiple holes (31) are defined near the edges of the soft panel (30). The rigid panel (40) has multiple through holes (not numbered) near the edges corresponding to the respective holes (31) in the soft panel (30). Multiple locating pins (41) are inserted respectively through the multiple through holes in the rigid panel (40). The multiple holes (31) and corresponding multiple locating pins (41) are configured such that the soft panel (30) will be in proper alignment when mounted on the rigid panel (40). The soft panel (30) and the rigid panel (40) are bonded together under heat and pressure to form a composite circuit board.

However, the soft panel (30) and the rigid panel (40) are made of different material and have different expansion and contraction rates when heated or cooled. Hence, it is difficult for the soft panel (30) to remain in proper alignment on the rigid panel (40) and the further processing of the composite circuit board, such as exposure or drilling, is made difficult. Furthermore, as panel size increases, the degree of the alignment problem is multiplied. Hence, the panel sizes for composite circuit boards are limited to between 250 mm to 500 mm.

Therefore, the invention provides a composite circuit board to mitigate or obviate the aforementioned problems.

SUMMARY OF THE INVENTION

The main objective of the present invention is to provide a composite circuit board, on which multiple soft panels are mounted on a rigid panel accurately and remain in proper alignment after bonding.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
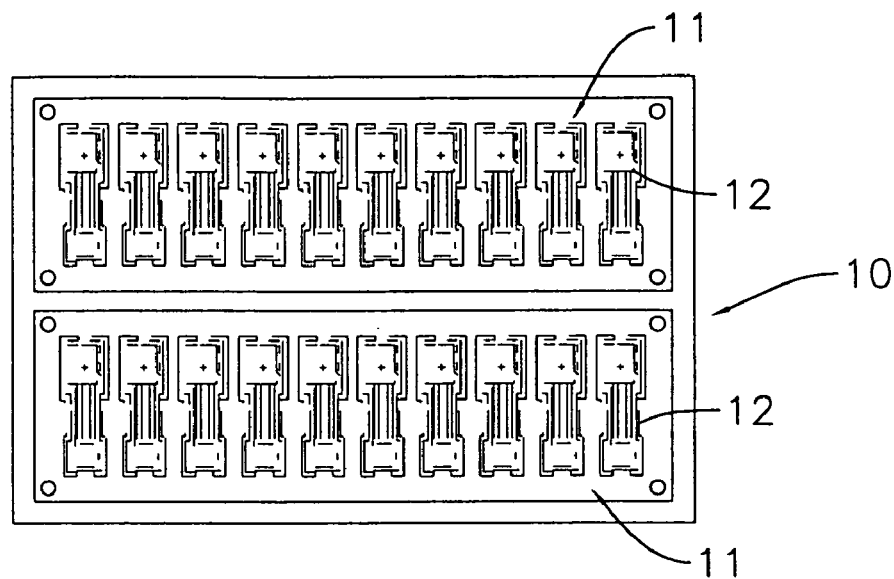
FIG. 1 is a top view of a soft panel of a composite circuit board in accordance with the present invention.

With reference to FIG. 1, a large soft panel (10) has multiple circuit groups (11) mounted thereon and in alignment with each other. Multiple circuit units (12) are formed in rows in the circuit groups (11). Multiple holes (14) are defined in the periphery of each circuit group (11).

Figure 2:
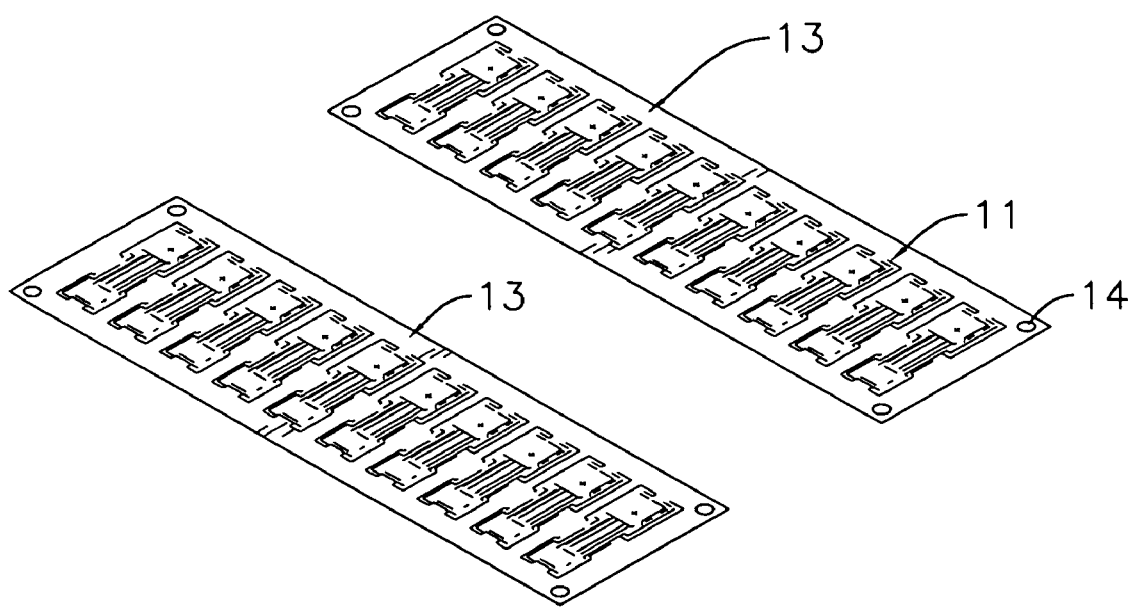
FIG. 2 is a perspective view of two soft panels of the composite circuit board in accordance with the present invention.

With reference to FIG. 2, the large soft panel (10) is then divided into the multiple smaller soft panels (13) and the multiple holes (14) are now defined in corners of the smaller soft panels (13).

Figure 3:
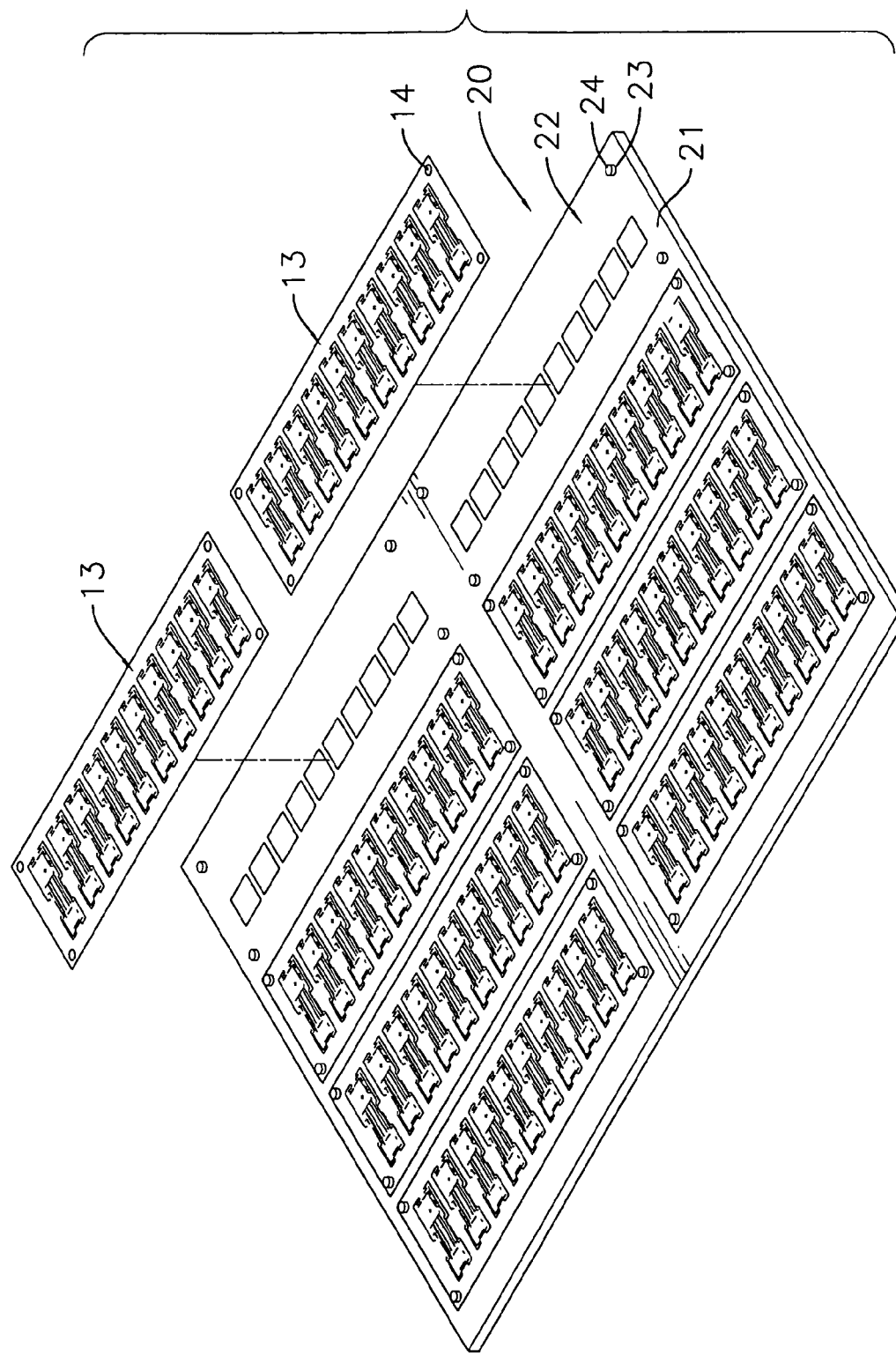
FIG. 3 is a perspective view of a rigid panel combined with multiple soft panels of the composite circuit board in accordance with the present invention.
Figure 4:
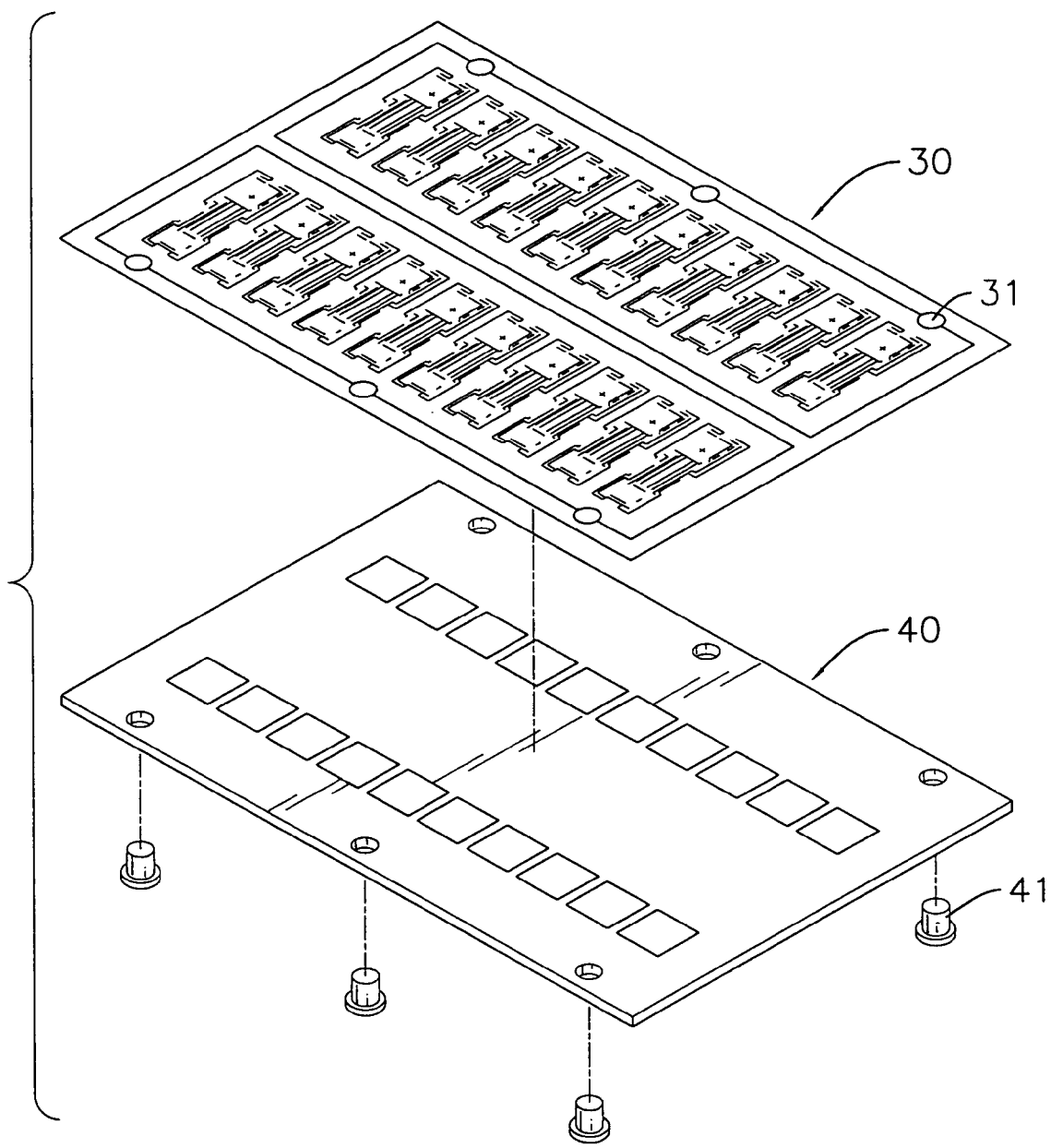
FIG. 4 is an exploded perspective view of a conventional composite circuit board.

With reference to FIG. 3, a preferred embodiment of a composite circuit board comprises multiple soft panels (13) and a rigid panel (20). The rigid panel (20), formed as a single-level panel or combined with multi-levels panels, has a connection surface (21) formed on a top surface. Multiple zones (22) are defined on the rigid panel (20) and are in alignment with each other. Each zone (22) has circuitry provided thereon and multiple openings (23) are defined in the corners of each zone (22) to correspond to the holes (14) in the soft panels (13). Multiple locating pins (24) are mounted in the openings (23) in the rigid panel (20).

During assembly, the soft panels (13) are mounted on the connecting surface (21) and aligned in the respective zones (22) by the locating pins (24) on the rigid panel (20) and the corresponding holes (14) in the soft panels (13). The soft panels (13) are then molecularly bonded to the rigid panel (20) under heat and pressure.

A method for manufacturing a composite circuit board in accordance with the present invention comprises acts of:

(a) providing multiple soft panels (13);

(b) providing a rigid panel (20) larger than each soft panel (13)

(c) putting the soft panels (13) on the connecting surface (21) and aligned in the respective zones (22), by the locating pins (24) mounted in the rigid panel (20) and the corresponding holes (14) in the soft panels (13);

(d) molecularly bonding the soft panels (13) bonded to the rigid panel (20) under heat and pressure; and (e) dividing the rigid panel (20) into multiple pieces according to the soft panels (13) to form multiple composite circuit boards.

In other preferred embodiments of the composite circuit board, the soft panels (13) is secured to the rigid panel (20) with a pre-securing process before being molecularly bonded to the rigid panel (20) via fasteners, ultrasonic weld, or heat weld.

The advantages of the composite circuit board in accordance with the present invention are described as follows:

1. When the soft panels are bonded on the rigid panel via heat welding, the degree of expansion and contraction is smaller relative to the smaller size of the soft panels. Therefore, the soft panels can be mounted on the rigid panel accurately and remain in proper alignment.

2. Soft panels of different sizes or with different circuitry can be mounted on a single rigid panel so that composite circuit board of different sizes or types can be easily produced and would help lower manufacturing costs.

It is to be understood, however, that even though numerous characteristics and advantages of the present invention have been set forth in the foregoing description, together with details of the structure and function of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A method for manufacturing a composite circuit board comprising acts of:
   providing multiple soft panels having circuit groups in alignment and multiple holes defined in a periphery of each circuit group;
   providing a rigid panel larger than each soft panel and having
      a connecting surface formed on a top surface thereof,
      multiple zones in alignment defined on the connecting surface and having
         circuits and,
         multiple openings defined in corners in which multiple locating pins are mounted, respectively;
   putting the soft panels on the connecting surface and aligned in the respective zones, by the locating pins mounted in the rigid panel and the corresponding holes in the soft panels;
   molecularly bonding the soft panels bonded to the rigid panel under heat and pressure; and
   dividing the rigid panel into multiple pieces according to the soft panels to form multiple composite circuit boards.

2. The method for manufacturing a composite circuit board as claimed in claim 1 further comprising a pre-securing process of securing the soft panels to the rigid panel before the soft panels being molecularly bonded to the rigid panel.

3. The method for manufacturing a composite circuit board as claimed in claim 2, wherein the pre-securing process is securing the soft panels to the rigid panel via fasteners.

4. The method for manufacturing a composite circuit board as claimed in claim 2, wherein the pre-securing process is securing the soft panels to the rigid panel via ultrasonic weld.

5. The method for manufacturing a composite circuit board as claimed in claim 2, wherein the pre-securing process is securing the soft panels to the rigid panel via heat weld.

* * * * *